(12) United States Patent
Graham et al.

(10) Patent No.: US 7,265,376 B2
(45) Date of Patent: Sep. 4, 2007

(54) NON-VOLATILE MEMORY CELL, MEMORY CELL ARRANGEMENT AND METHOD FOR PRODUCTION OF A NON-VOLATILE MEMORY CELL

(75) Inventors: Andrew Graham, München (DE); Franz Hofmann, München (DE); Wolfgang Hönlein, Unterhaching (DE); Johannes Kretz, München (DE); Franz Kreupl, München (DE); Erhard Landgraf, München (DE); Richard Johannes Luyken, München (DE); Wolfgang Rösner, Ottobrunn (DE); Thomas Schulz, Austin, TX (US); Michael Specht, München (DE)

(73) Assignee: Infineon Technologies, Inc., Munich (DE)

( * ) Notice: Subject to any disclaimer, the term of this patent is extended or adjusted under 35 U.S.C. 154(b) by 113 days.

(21) Appl. No.: 10/533,215

(22) PCT Filed: Oct. 29, 2003

(86) PCT No.: PCT/DE03/03588

§ 371 (c)(1),
(2), (4) Date: Apr. 28, 2005

(87) PCT Pub. No.: WO2004/040667

PCT Pub. Date: May 13, 2004

(65) Prior Publication Data

US 2006/0011972 A1    Jan. 19, 2006

(30) Foreign Application Priority Data

Oct. 31, 2002 (DE) ................ 102 50 829

(51) Int. Cl.
*H01L 35/24* (2006.01)
*H01L 51/00* (2006.01)
*H01L 29/788* (2006.01)
*H01L 21/336* (2006.01)

(52) U.S. Cl. ........... 257/40; 257/314; 257/315; 438/257; 438/259

(58) Field of Classification Search .......... 257/40, 257/314–324, 330–334
See application file for complete search history.

(56) References Cited

U.S. PATENT DOCUMENTS 5,899,734 A    5/1999  Lee (Continued)

FOREIGN PATENT DOCUMENTS

DE    100 36 897 C1    7/2000

(Continued)

OTHER PUBLICATIONS

English Translation of International Preliminary Report from corresponding international Application No. PCT/DE2003/003588.

(Continued)

*Primary Examiner*—Cuong Nguyen
(74) *Attorney, Agent, or Firm*—Brinks Hofer Gilson & Lione

(57) ABSTRACT

A nonvolatile memory cell, memory cell arrangement, and method for production of a nonvolatile memory cell is disclosed. The nonvolatile memory cell includes a vertical field-effect transistor (FET). The FET contains a nanoelement arranged as a channel region and an electrically insulating layer. The electrically insulating layer at least partially surrounds the nanoelement and acts as a charge storage layer and as a gate-insulating layer. The electrically insulating layer is arranged such that electrical charge carriers may be selectively introduced into or removed from the electrically insulating layer and the electrical conductivity characteristics of the nanoelement may be influenced by the electrical charge carriers introduced into the electrically insulating layer.

26 Claims, 5 Drawing Sheets

U.S. PATENT DOCUMENTS

| | | | |
|---|---|---|---|
| 6,361,861 B2 | 3/2002 | Gao et al. | |
| 6,407,426 B1 | 6/2002 | Ahn et al. | |
| 6,707,098 B2 | 3/2004 | Hofmann et al. | |
| 6,740,910 B2 | 5/2004 | Roesner et al. | |
| 6,798,000 B2 * | 9/2004 | Luyken et al. | 257/213 |
| 6,930,343 B2 * | 8/2005 | Choi et al. | 257/296 |
| 2001/0023986 A1 | 9/2001 | Mancevski | |
| 2002/0001905 A1 | 1/2002 | Choi et al. | |
| 2002/0130311 A1 | 9/2002 | Cui et al. | |
| 2005/0145838 A1 * | 7/2005 | Furukawa et al. | 257/20 |

FOREIGN PATENT DOCUMENTS

| | | |
|---|---|---|
| DE | 10032370 | 12/2001 |
| EP | 1 170 799 A2 | 1/2002 |

OTHER PUBLICATIONS

S.J. Wind, A. Appenzeller, R. Martel, V. Derycke and Ph. Avouris, *Vertical Scaling of Carbon Nontube Field-Effect Transistors Using Top Gate Electrodes*, pp. 3817-3819, vol. 80, No. 20, May 20, 2002.

M.S. Fuhrer, B.M. Kim, T. Durkop and T. Brintlinger, *High-Mobility Nanotube Transistor Memory*, pp. 755-759, vol. 2, No. 7, American Chemical Society 2002.

M. Radosavljevic, M. Freitag, K.V. Thadani, A.T. Johnson, *Nonvolatile Molecular Memory Elements Based on Ambipolar Nanotube Field Effect Transistors*, pp. 761-764, vol. 2, No. 7, American Chemical Society, 2002.

Howard Pein and James D. Plummer, *Performance of the 3-D PENCIL Flash EPROM Cell and Memory Array*, pp. 1982-1991, No. 11, IEEE Transactions on Electron Devices, Nov. 1995.

The International Examination Report from corresponding PCT patent application No. PCT/DE03/03588.

The International Search Report from corresponding PCT patent application No. PCT/DE03/03588.

* cited by examiner

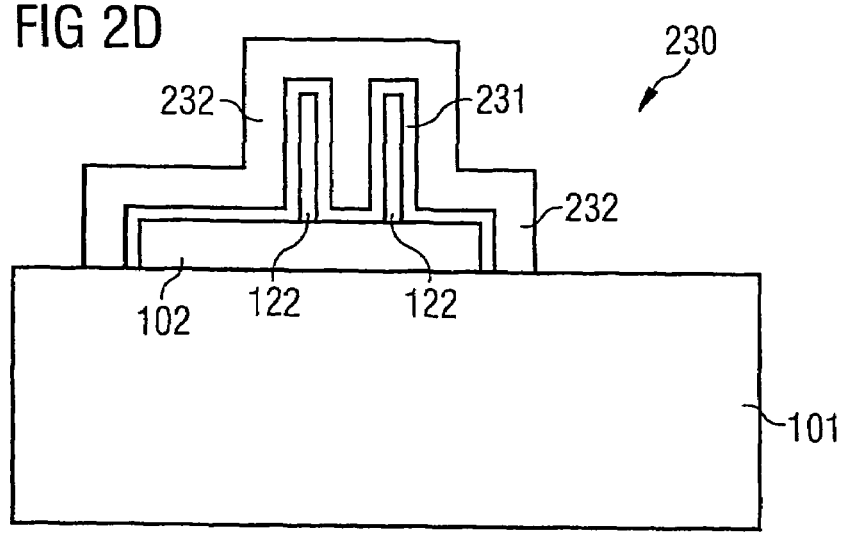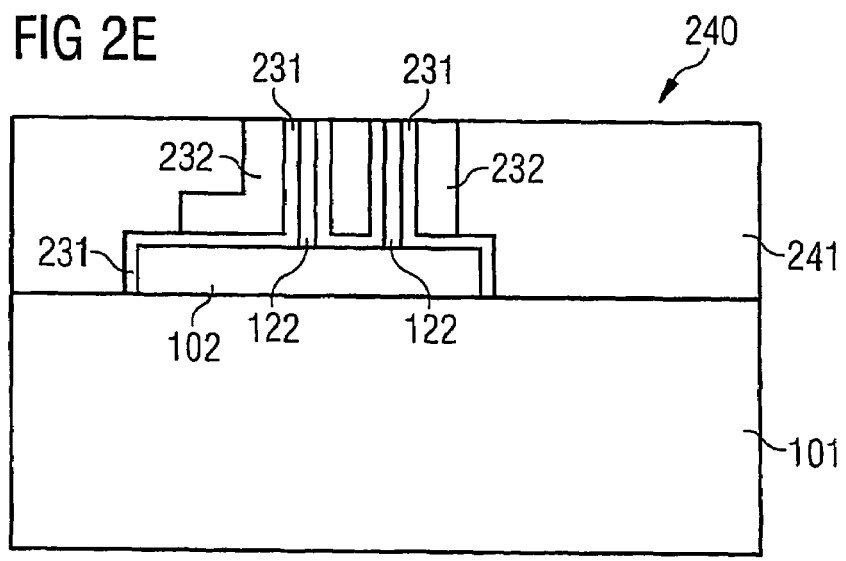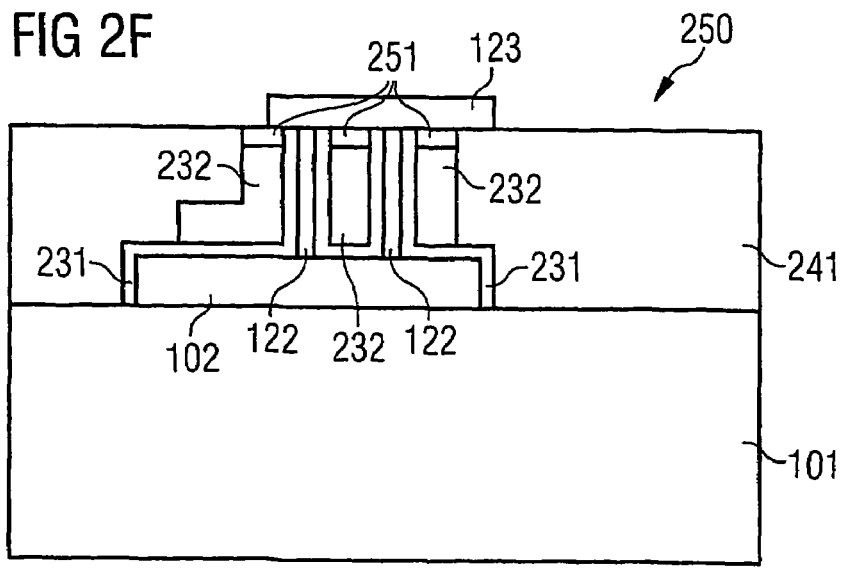

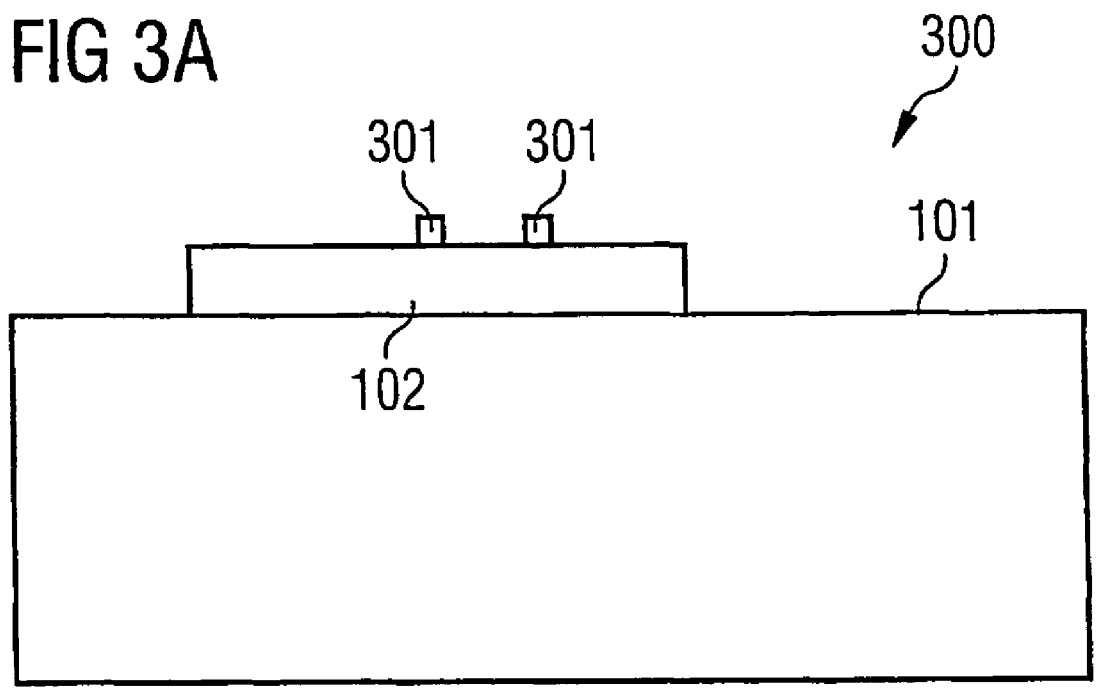
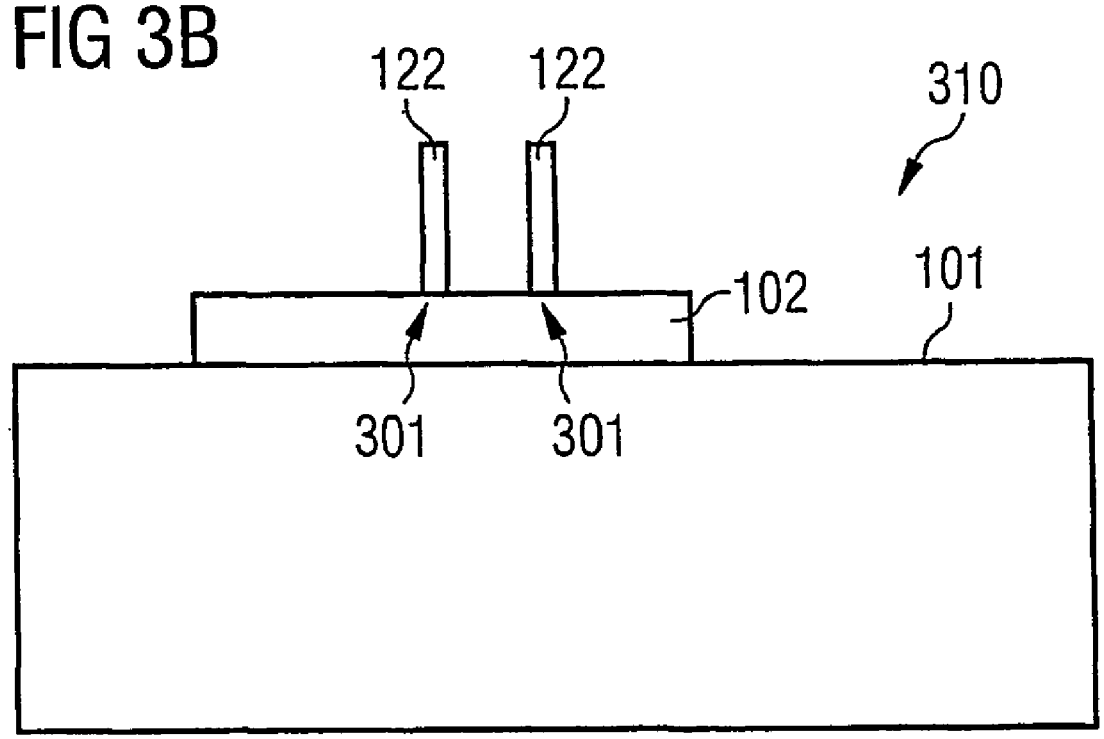

NON-VOLATILE MEMORY CELL, MEMORY CELL ARRANGEMENT AND METHOD FOR PRODUCTION OF A NON-VOLATILE MEMORY CELL

PRIORITY CLAIM

This application is the national stage application of international application number PCT/DE03/03588, filed on Oct. 29, 2003, which claims the benefit of priority to German Patent Application 102 50 829.1, filed on Oct. 31, 2002, herein incorporated by reference.

TECHNICAL FIELD

The invention relates to a nonvolatile memory cell, to a memory cell array and to a method for fabricating a nonvolatile memory cell.

BACKGROUND

With ongoing miniaturization, conventional silicon microelectronics will reach its limits. In a field-effect transistor, continued miniaturization will lead to an increase in disruptive short-channel effects, which restrict the performance of the field-effect transistor. In addition to the problems which arise with a single component, in a memory array there are also limits on the extent to which the storage medium can be scaled, for example the capacitance in a DRAM (dynamic random access memory) cannot be scaled to any desired extent.

The use of carbon nanotubes is under discussion as a possible successor technology to silicon microelectronics. Basic principles of carbon nanotubes are described, for example, in [1]. It is known that carbon nanotubes (depending on the tube parameters) have an electrical conductivity which ranges from semiconducting to metallic.

It is known from [2] to introduce a via hole into a gate electrode layer and to grow a vertical nanoelement in this via hole. This results in a vertical field-effect transistor with the nanoelement as channel region, it being possible to control the electrical conductivity of the channel region by means of the gate electrode region, which surrounds the nanoelement over approximately its entire longitudinal extent.

[3] has disclosed a field-effect transistor having a carbon nanotube as channel region, which is applied horizontally to a substrate. At two end portions, the carbon nanotube is coupled to a first source/drain region and a second source/drain region, respectively. A gate-insulating layer is applied to the carbon nanotube. An electrically conductive gate region is applied to the gate-insulating layer in a region between the two source/drain regions, it being possible to control the conductivity of the carbon nanotube by applying an electric voltage to the gate region. The carbon nanotube which has been applied horizontally in accordance with [3] means that a field-effect transistor of this type takes up a large amount of space, which runs contrary to the trend toward miniaturization.

Furthermore, it is known from the prior art to use what is known as an EEPROM (electrically erasable programmable read-only memory) memory cell or a flash memory cell as the permanent memory; in these memory cells, the stored information is coded in electrical charge carriers stored in a floating gate or in a charged storage layer. Information contained in the electrically conductive floating gate or in the electrically insulating charge storage layer (trapping layer) can be read by shifting the threshold voltage of the memory transistor.

However, the known EEPROM or flash memory cells have the problem that disruptive short-channel effects occur in the transistors involved with continued miniaturization.

[4] discloses an electronic component formed from electrically conductive first nanowires, a layer system applied to the first nanowires, and second nanowires applied to the layer system, the first and second nanowires being arranged at an angle to one another. Charge carriers generated by the nanowires can be stored in the layer system.

[5], [6] each disclose a memory cell comprising a silicon substrate as gate region, a silicon oxide layer formed on the silicon substrate and a nanotube formed thereon, it being possible for charge carriers to be introduced into the silicon oxide layer.

[7] discloses a vertical nanodimensional transistor using carbon nanotubes, and a method for fabricating a transistor of this type.

[8] discloses a field-effect transistor having a first nanotube and a second nanotube, the first nanotube forming a source region, a channel region and a drain region, and the second nanotube forming a gate region.

[9] discloses carbon nanotubes, the hollow cores of which are filled with a conductive filling material.

[10] discloses a system and a method for fabricating logic devices having carbon nanotube transistors.

BRIEF SUMMARY

The invention is based on the problem in particular of providing a nonvolatile memory cell which allows an increased integration density compared to the prior art.

The nonvolatile memory cell includes a vertical field-effect transistor with a nanoelement designed as the channel region. Furthermore, an electrically insulating layer, which at least partially surrounds the nanoelement, is provided as charge storage layer and as gate-insulating layer. This electrically insulating layer is designed in such a manner that electrical charge carriers can be selectively introduced into or removed from it. Furthermore, the charge storage layer is designed in such a manner that the electrical conductivity of the nanoelement can be influenced in a characteristic way by electrical charge carriers introduced in the electrically insulating layer.

Moreover, the invention provides a memory cell array having a plurality of memory cells with the features described above formed next to and/or on top of one another.

In accordance with the method according to the invention for fabricating a nonvolatile memory cell, a vertical field-effect transistor is formed with a nanoelement designed as channel region. Furthermore, an electrically insulating layer, which at least partially surrounds the nanoelement, is formed as charge storage layer and as gate-insulating layer. The electrically insulating layer is designed in such a manner that electrical charge carriers can be selectively introduced into or removed from it. Furthermore, the electrically insulating layer is designed in such a manner that the electrical conductivity of the nanoelement can be influenced in a characteristic way by electrical charge carriers introduced in the electrically insulating layer.

One basic idea of the invention is that a nonvolatile vertical transistor memory cell having a nanoelement with a dimension in the nanometer range is created, with the gate-insulating layer clearly also being used as a charge storage layer. By using a vertical field-effect transistor, the channel region can be made sufficiently long to avoid disruptive short-channel effects and at the same time, on account of the vertical arrangement, to achieve a high integration density. The small cross-sectional area of a nanoelement in the region of a few nanometers allows an extraordinary high integration density, i.e. density of memory cells in a memory cell array. The use of the electrically insulating layer surrounding the nanoelement as a charge storage layer makes the parameters of the field-effect transistor (in particular the threshold voltage) dependent in a particularly sensitive way on electrical charge carriers introduced therein. Charge carriers of this type can be introduced into the nonvolatile memory cell, or more specifically into its charge storage layer, for example by means of Fowler-Nordheim tunneling. This ensures sufficiently reliable writing, reading and erasing of information in the nonvolatile memory cell. If an electrically insulating layer is used as the charge storage layer and at the same time as the gate-insulating layer, for example an ONO layer or an aluminum oxide layer, a sufficiently long retention time for a stored item of information is combined with a sufficient read speed.

One significant advantage of the memory cell according to the invention is that on account of the very small diameter of the nanoelement of the order of magnitude of 1 nanometer and on account of the vertical arrangement of the nanoelements, a significantly higher scalability is provided compared to conventional planar flash cells. A further advantage is that the nanoelements have a significantly improved current driver capacity compared to conventional silicon transistors. A further advantage is that in the memory cell according to the invention the channel region of the transistor does not have to be machined out of a single-crystal starting material, which in conventional silicon microelectronics has led to arrays being restricted substantially to two dimensions.

Clearly, it can be regarded as an important aspect of the invention that an advantageous combination of the electrical properties of nanoelements with processes used in silicon microtechnology to fabricate a highly scalable permanent electrical memory is realized.

According to the invention, a vertical field-effect transistor with a nanoelement as channel region is configured and operated in such a way that it can be used as a permanent memory element. For this purpose, a gate dielectric (e.g. aluminum oxide, $Al_2O_3$) or a layer sequence of dielectrics (e.g. silicon oxide/silicon nitride/silicon oxide, ONO layer sequence) is selected such that it is possible to store electrical charge carriers and to write to the memory cell and erase the stored information.

Clearly, one aspect of the invention can be regarded as residing in the fact that an NROM (nitrided read-only memory) flash memory with a vertical nanoelement as channel region is created.

It is preferable for the electrically insulating layer to be a silicon oxide/silicon nitride/silicon oxide layer sequence or an aluminum oxide layer sequence. Furthermore, a suitably designed silicon nitride layer, a hafnium oxide layer or any other desired electrically insulating layer can be used as charge storage layer.

The nanoelement may include a nanotube, a bundle of nanotubes or a nanorod. If the nanoelement is realized in nanorod form, the nanorod may be formed from silicon, germanium, indium phosphide, gallium nitride, gallium arsenide, zirconium oxide and/or a metal.

If the nanoelement is configured in nanotube form, the nanotube may be a carbon nanotube, a carbon-boron nanotube, a carbon-nitrogen nanotube, a tungsten sulfide nanotube or a chalcogenide nanotube.

The memory cell according to the invention may include a first electrically conductive layer as first source/drain region of the field-effect transistor, on which the nanoelement has grown. The first electrically conductive layer may in particular be produced from a material which catalytically assists the growth of carbon nanotubes. In this scenario, the first electrically conductive layer can be used to catalyze the formation of the nanoelement and at the same time as a source/drain region.

Furthermore, the memory cell may include a second electrically conductive layer as gate region of the field-effect transistor, which at least partially surrounds the electrically insulating layer. According to this configuration, the gate region surrounds the nanoelement, separated by the annular or hollow-cylindrical electrically insulating layer arranged between them, thereby allowing particularly sensitive driving of the nanoelement.

The memory cell according to the invention may include a third electrically conductive layer as second source/drain region of the field-effect transistor, which is formed on the nanoelement.

The memory cell may be formed on and/or in a substrate, which may be produced from polycrystalline or amorphous material. One advantage of the invention is that there is no need to use an expensive single-crystal silicon substrate for the memory cell architecture according to the invention, and instead an inexpensive substrate can be employed.

The memory cell may be formed exclusively from dielectric material, metallic material and material of the nanostructure. In a configuration of this type, there is often no need to use an expensive semiconductor substrate (for example a crystalline silicon wafer).

The thickness of the second electrically conductive layer may be less than a longitudinal extent of the nanoelement, such that the electrically insulating layer surrounding the nanoelement and the second electrically conductive layer form a ring structure surrounding part of the nanoelement.

The electrically insulating layer which at least partially surrounds the nanoelement may be provided such that it surrounds the nanoelement in the shape of a ring, which electrically insulating layer forms the gate insulation layer and the charge storage layer of the vertical transistor memory cell. Furthermore, at least part of the electrically insulating ring may be surrounded by the second electrically conductive layer, which forms the gate electrode of the vertical switching transistor and the word line.

On account of the fact that the semiconducting nanoelement is surrounded, in a partial region thereof, by an electrically insulating ring structure rather than by a hollow-cylindrical electrically insulating structure, a gate insulating layer and, at the same time, a charge storage layer are provided and surrounded by the first electrically conductive region functioning as a gate electrode. By applying a suitable voltage to the gate region, it is possible to influence the conductivity of the nanoelement in a particularly sensitive way in the region of the nanoelement functioning as channel region, which is surrounded by the ring structure. On account of the electrostatic peak effect, the use of an annular gate insulation layer allows the amplitude of an electric field generated in the vicinity of the nanoelement by the application of an electric voltage to the gate electrode or by the introduction of electrical charge carriers into the charge storage layer to be made particularly powerful, so that particularly accurate control of the electrical conductivity of the channel region is made possible. As a result, by using a ring structure as gate insulation layer, it is possible to create a memory cell with a particularly high level of accuracy and robustness with respect to errors when reading stored information. A ring structure of this type can be produced, for example, by selecting the thickness of the second electrically conductive layer to be thinner, preferably significantly thinner, than the longitudinal extent of the nanoelement.

The following text provides a more detailed description of the method according to the invention for fabricating a nonvolatile memory cell. Configurations of the memory cell also apply to the method for fabricating the memory cell, and vice versa.

According to the method, a first electrically conductive layer can be formed as first source/drain region of the field-effect transistor, and then a second electrically conductive layer can be formed as gate region of the field-effect transistor. A subregion of the first electrically conductive layer can be uncovered by introducing a via hole into the second electrically conductive layer. Furthermore, the electrically insulating layer can be formed on the surface of the via hole. The nanoelement can be grown in the via hole on the uncovered subregion of the first electrically conductive layer, preferably being formed by means of thermal oxidation. If electrically insulating material is introduced into the via hole, it should be ensured that the via hole does not become blocked, in order to make sure that the memory cell functions perfectly.

It is in this way possible, with little outlay on costs and time, to fabricate the memory cell according to the invention.

Alternatively, a first electrically conductive layer can be formed as a first source/drain region of the field-effect transistor, and then an auxiliary layer can be formed. A subregion of the first electrically conductive layer can be uncovered by introducing a via hole into the auxiliary layer. The nanoelement can be grown in the via hole on the uncovered subregion of the first electrically conductive layer and the auxiliary layer removed. The electrically insulating layer can then be applied to the surface of the nanoelement. According to this configuration, the electrically insulating layer, as charge storage layer and as gate-insulating layer, can evidently be applied to an uncovered nanoelement itself, which opens up a wide range of options for the choice of material for the charge storage layer. Furthermore, the risk of the via hole becoming blocked when electrically insulating material is being introduced into it is particularly reliably avoided by means of this configuration.

According to a further alternative, the nanoelement can initially be grown vertically while standing freely on a source/drain region, and then the remainder of the vertical field-effect transistor can be formed.

By way of example, in this configuration spots of catalyst material with a small diameter can be applied to a substrate using a lithography process and an etching process, and vertical or substantially vertical nanoelements can be grown in free-standing form on the lithographically defined spots of catalyst material. Then, the further components of the vertical field-effect transistor can be formed around the nanoelement which has grown. By way of example, first of all electrically insulating material can be deposited on the nanoelement as gate-insulating layer and, at the same time, as charge storage layer, and then the further components (gate region, second source/drain region, etc.) can be formed. The spots of catalyst material may be formed, for example, from nickel material with a diameter of approximately 50 nm. It is then possible to form vertical, free-standing carbon nanotubes, in particular using a plasma-CVD (chemical vapor deposition) process, without it being necessary first to form pores in a layer as templates for the growth of the carbon nanotubes.

The memory cell according to the invention can be fabricated in such a way that a gate electrode made from metallic or metallically conductive material is formed above another electrically conductive layer on a substrate. The metallic layer which is applied direct to the substrate can be used as a catalyst for the subsequent growth of the nanotubes or nanowires. At the same time, it can perform the function of a first source/drain region. An arrangement of pores can be produced in the stack, for example by introducing via holes into the gate electrode using electron beam lithography and an anisotropic etching process. The catalyst layer can be uncovered by means of the pores produced in this way. The side walls of the pores, as the surface of the gate electrode, can be covered with a dielectric or with a layer sequence of dielectrics (e.g. an ONO layer sequence). The pore base of the lower electrically conductive layer can then optionally be uncovered if it is covered by the previously deposited dielectric material. Then, in a CVD (chemical vapor deposition) method step, the preferably semiconducting nanotubes or nanowires can be grown in the pores on the catalyst layer that has been uncovered at the pore base. The memory cell according to the invention can be completed by the deposition and patterning of a second source/drain electrode.

When operating the memory cell, stored information which is coded in electrical charge carriers which have been or are introduced into the charge storage layer is programmed, erased or read. Stored information is programmed/erased preferably by Fowler-Nordheim tunneling or by tunneling of hot electrons or hot holes, with the result that electrical charge carriers (electrons, holes) are durably introduced into or removed from the charge storage layer. Reading the stored information makes use of the effect whereby the electrical properties of the memory cell field-effect transistor are influenced in a characteristic way by charge carriers introduced in the charge storage layer. By way of example, the threshold voltage of the field-effect transistor is modified as a function of the quantity and type (positive or negative charge) of the charge carriers contained in the charge storage layer. Therefore, when a predeterminable electric voltage is applied between the source/drain regions of the field-effect transistors, the level of the resulting electrical current can be used to determine the stored information in the memory cell.

A further important aspect of the memory cell architecture according to the invention is that of providing a circuit having a plurality of different components (e.g. logic components, field-effect transistors and memory cells according to the invention) which are connected to one another.

BRIEF DESCRIPTION OF THE DRAWINGS

Exemplary embodiments of the invention are illustrated in the figures and explained in more detail in the text which follows. In the drawing:

FIGS. 2A to 2E show layer sequences at different times during a method for fabricating a memory cell in accordance with a second exemplary embodiment of the invention, FIG. 2F shows a nonvolatile memory cell in accordance with a second exemplary embodiment of the invention, FIGS. 3A, 3B show layer sequences at various times during a method for fabricating a memory cell in accordance with a third exemplary embodiment of the invention.

Identical or similar components in different figures are denoted by the same reference symbols.

DETAILED DESCRIPTION

Figure 1A:
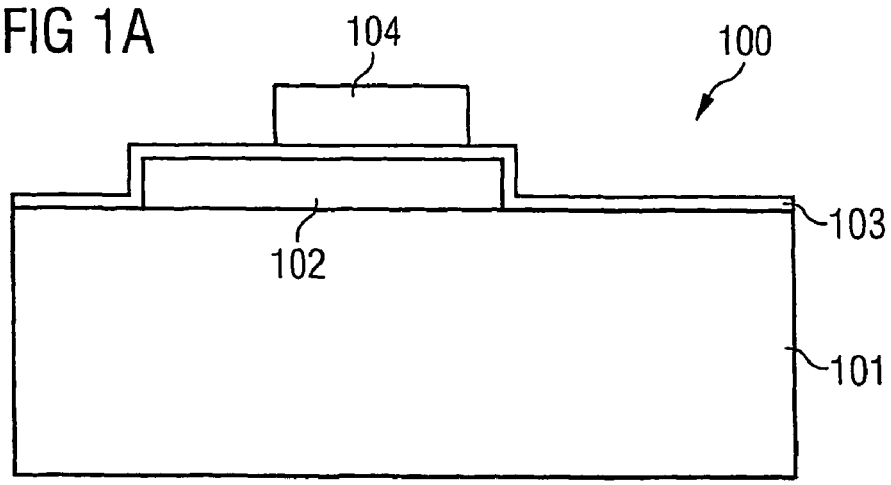
FIGS. 1A, 1B show layer sequences at different times during a method for fabricating a memory cell in accordance with a first exemplary embodiment of the invention.
Figure 1B:
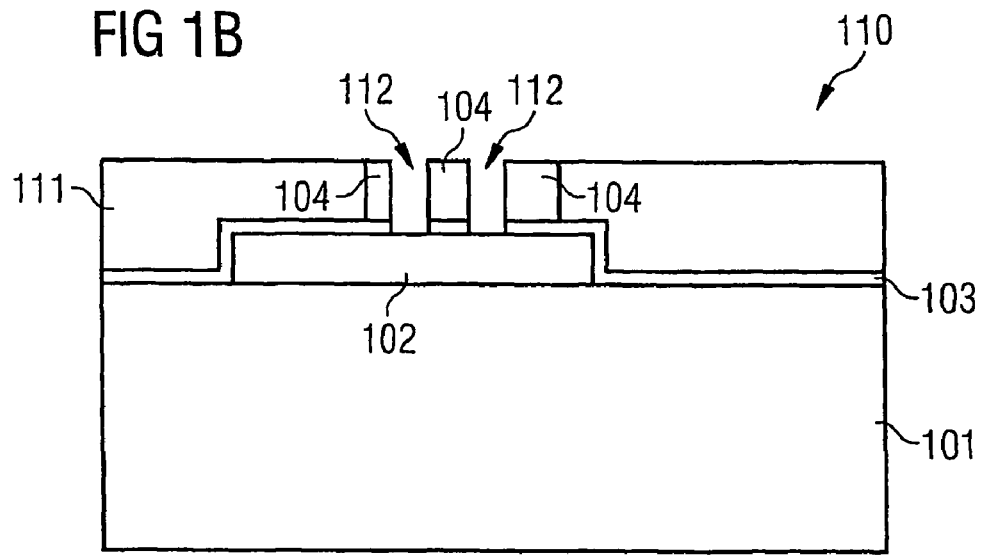
Figure 1C:
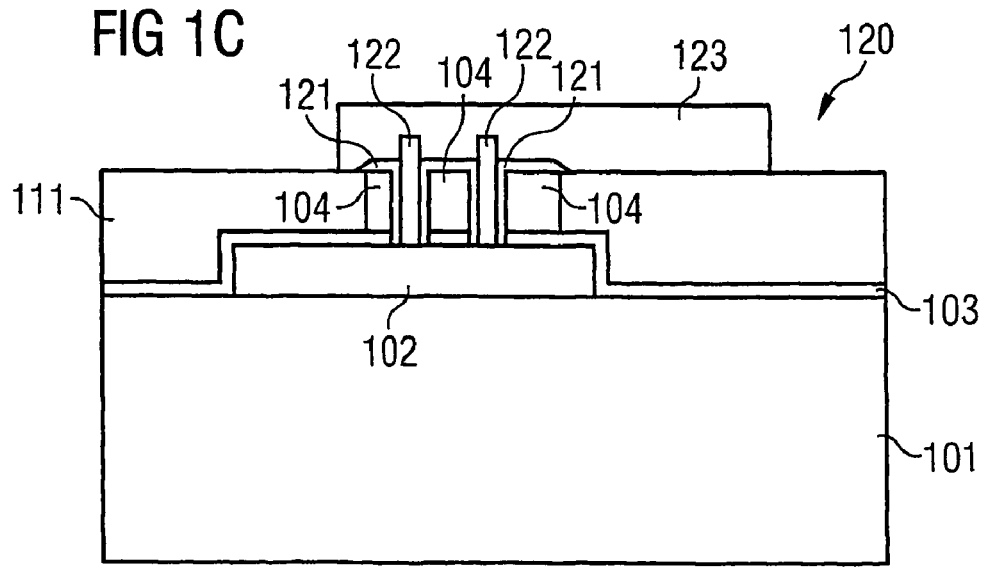
FIG. 1C shows a nonvolatile memory cell in accordance with a first exemplary embodiment of the invention.

The following text, referring to FIG. 1A to FIG. 1C, describes a method for fabricating a memory cell in accordance with a first exemplary embodiment of the invention.

To obtain the layer sequence 100 shown in FIG. 1A, a material which is catalytically active for the growth of carbon nanotubes (e.g. nickel, cobalt or iron) is deposited on a glass substrate 101 (a silicon substrate etc. may also be used as an alternative) and patterned in such a manner that a first source/drain region 102 is formed on the glass substrate 101 as a result.

Furthermore, a first electrically insulating layer 102 is formed on the layer sequence obtained in this way by the deposition of silicon nitride material. Alternatively, this layer may also be produced from another dielectric material, for example silicon oxide or aluminum oxide. In a further method step, aluminum material is deposited on the layer sequence obtained and patterned using a lithography process and an etching process, in such a manner that a gate region 104 is formed as a result. Alternatively, it is also possible for polysilicon material, tantalum nitride material, etc. to be used instead of aluminum material.

To obtain the layer sequence 110 shown in FIG. 1B, a second electrically insulating layer 111 is deposited on the layer sequence 100 and planarized using a CMP (chemical mechanical polishing) process, with the gate region 104 as stop layer. Furthermore, using a lithography process and an etching process, via holes 112 are introduced into the gate region 104 and into the first electrically insulating layer 103. This obviously forms a porous mask, with the pores or via holes 112 being used as templates for the growth of carbon nanotubes in a subsequent method step.

To obtain the nonvolatile memory cell 120 in accordance with a first exemplary embodiment of the invention shown in FIG. 1C, first of all a gate-insulating charge storage layer 121 is formed by thermal oxidation on uncovered surface regions of the gate region 104 formed from aluminum material. Therefore, the gate-insulating charge storage layer 121 is formed from aluminum oxide material. Alternatively, it is possible to carry out conformal deposition of a dielectric material, followed by an anisotropic etchback in order to form the gate-insulating charge storage layer 121. The gate-insulating charge storage layer 121 simultaneously serves as gate-insulating region of the field-effect transistor and as charge storage layer of the memory cell 120, into which charge storage layer 120 electrically charge carriers can be selectively introduced and/or from which charge storage layer 120 electrical charge carriers can be selectively removed. Furthermore, the gate-insulating charge storage layer 121 is designed in such a manner that the electrical conductivity of a carbon nanotube that is subsequently to be formed can be influenced in a characteristic way by means of electrical charge carriers introduced in the gate-insulating charge storage layer 121.

In a further method step, semiconducting carbon nanotubes 122 are grown in the via holes 112 using a CVD (chemical vapor deposition) process, with the nickel material of the first source/drain region 102 catalytically assisting the growth of the carbon nanotubes 122. In an optional further method step, additionally electrically insulating material can be deposited in order to fill any cavities between the gate-insulating charge storage layer 121 and the carbon nanotubes 122 formed in a respective via hole 112. The layer sequence obtained in this way is planarized using a CMP process. Furthermore, the deposited material is reactively etched back in order, in accordance with FIG. 1C, to uncover upper end portions of the carbon nanotubes 122 for the purpose of contact-connection to a source/drain region that is subsequently to be applied. Thereafter, nickel material is deposited as second source/drain region 123, in such a manner that the uncovered upper portions of the carbon nanotubes 122 are contact-connected to the material of the second source/drain region 123.

This produces the nonvolatile memory cell 120 shown in FIG. 1C. This memory cell includes two carbon nanotubes 121. Of course, it is possible for a memory cell according to the invention to be formed using just one carbon nanotube or more than two carbon nanotubes. Electrical charge carriers can be selectively introduced into the gate-insulating charge storage layer 121 by Fowler-Nordheim tunneling or by tunneling of hot electrons (or hot holes). When charge carriers of this type have been permanently introduced into the gate-insulating charge storage layer 121 made from aluminum oxide material, the electrical properties (e.g. threshold voltage) of the associated transistor have been changed in a characteristic way, so that when a predeterminable electric voltage is applied between the two source/drain regions 102, 123, the level of electric current which flows through the channel region 122 is dependent in a characteristic way on the number and sign of the charge carriers introduced in the gate-insulating charge storage layer 121. The nonvolatile memory cell 120 can therefore be operated as a permanent memory cell with a long hold time, in which information can be stored in the charge storage layer 121 with a short programming time by the application of suitable electrical potentials to the source/drain regions 102, 123 and to the gate region 104. Furthermore, information can be removed or read out by application of suitable electrical potentials to the source/drain regions 102, 123 and to the gate region 104 with a sufficiently fast erase or read time.

The following text, referring to FIG. 2A to FIG. 2F describes a method for fabricating a memory cell in accordance with a second exemplary embodiment of the invention.

Figure 2A:
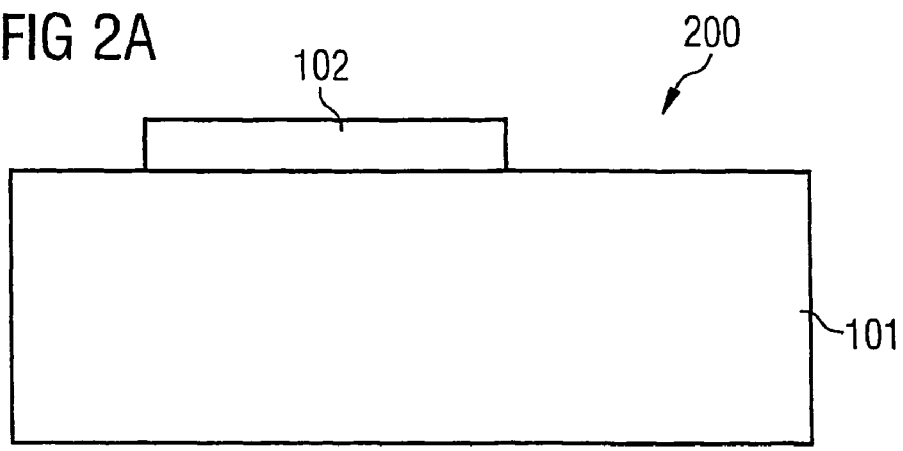

To obtain the layer sequence 200 shown in FIG. 2A, nickel material which has a catalytic activity for the growth of carbon nanotubes is deposited as first source/drain region 102 on a glass substrate 100.

Figure 2B:
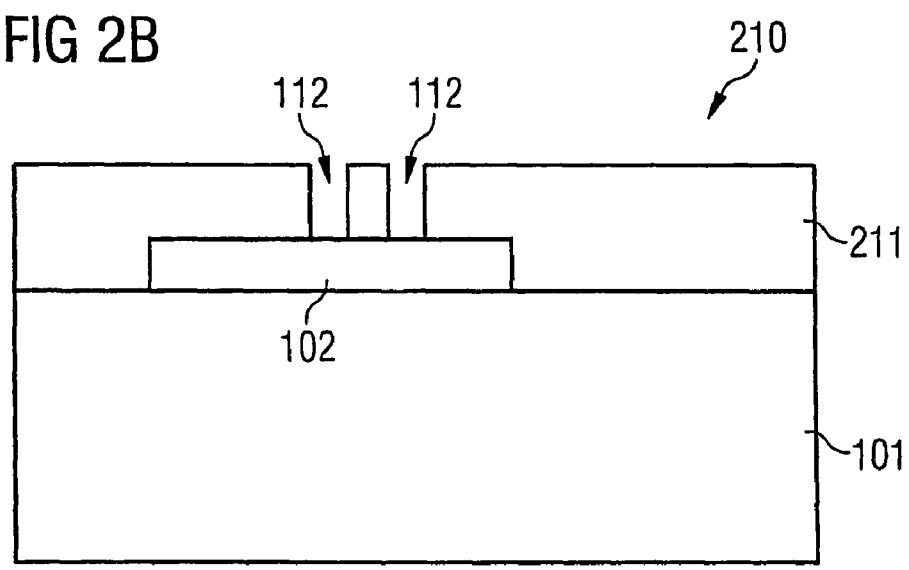

To obtain the layer sequence 210 shown in FIG. 2B, a silicon oxide layer 211 is deposited on the surface of the layer sequence 200 and patterned with a predeterminable porous mask using a lithography process and an etching process, in such a manner that via holes 122 are introduced into the silicon oxide layer 211. As a result, surface regions of the nickel material of the first source/drain region 102, which is catalytically active for the growth of carbon nanotubes, are uncovered. Furthermore, the via holes 112 serve as a mechanical guide for the subsequent growth of carbon nanotubes.

Figure 2C:
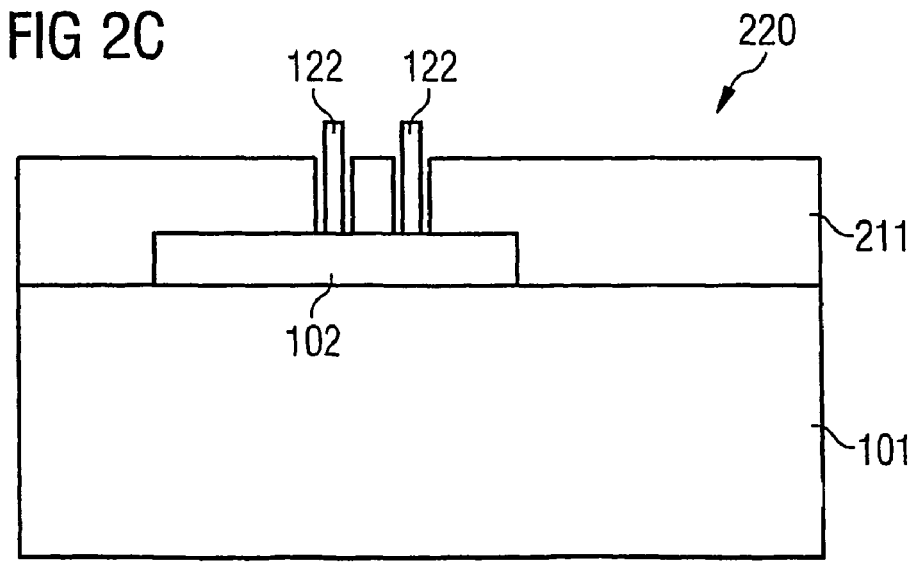

To obtain the layer sequence 220 shown in FIG. 2C, semiconducting carbon nanotubes 122 are grown vertically in the via holes 122 using a CVD process; on account of the catalytic action of the nickel material of the first source/drain region 102 for the growth of carbon nanotubes, the latter start to grow from the source/drain region 102.

To obtain the layer sequence 230 shown in FIG. 2D, the dielectric material of the silicon oxide layer 211 is removed using a selective etching process. Furthermore, a gate-insulating charge storage layer 231 having a storage function for electrical charge carriers is deposited on the carbon nanotubes 122 and the first source/drain region 102 using a conformal deposition process (e.g. using an ALD (atomic layer deposition) process)). According to the exemplary embodiment described, the gate-insulating charge storage layer 231 is realized as a silicon oxide/silicon nitride/silicon oxide layer sequence (ONO layer sequence). Using the ALD process, it is possible to set the thickness of a layer deposited to an accuracy of even one atomic layer, i.e. to an accuracy of a few Angstroms, and consequently a homogeneous thickness of the ONO layer sequence over the carbon nanotubes 122 is ensured. Furthermore, an electrically conductive layer 232 of tantalum nitride (or alternatively of doped polysilicon material) is deposited on the layer sequence obtained in this way and then processed in such a manner that it serves as gate region of the field-effect transistors of the memory cell.

To obtain the layer sequence 240 shown in FIG. 2E, a silicon nitride layer 241 is deposited on the layer sequence 230 and planarized using a CMP process, in such a manner that an upper end portion, as seen in FIG. 2E, of the carbon nanotubes 122 is uncovered.

To obtain the nonvolatile memory cell 250 shown in FIG. 2F, a surface region of the electrically conductive layer 232 serving as gate region is etched back using a selective etching process. Furthermore, dielectric material is deposited on the surface of the layer sequence obtained in this way and planarized using a CMP process. Electrically insulating decoupling elements 251 are formed as a result. Dielectric material can optionally be etched back. Then, nickel material is deposited on the surface of the layer sequence obtained in this way and patterned, with the result that a second source/drain region 123 is formed at the surface of the nonvolatile memory cell 250. The second source/drain region 123 is now coupled to upper end portions, as seen in FIG. 2F, of the carbon nanotubes 122.

Clearly, in the exemplary embodiment described with reference to FIG. 2A to FIG. 2F, the pore structure is removed following growth of the carbon nanotubes 121, and the further components of the memory cell are deposited on the uncovered carbon nanotubes 122. This has the advantage that in principle any desired materials can be used for the gate-insulating charge storage layer 231.

The following text, referring to FIG. 3A, FIG. 3B, describes a method for fabricating a nonvolatile memory cell in accordance with a third exemplary embodiment of the invention.

To obtain the layer sequence 300 shown in FIG. 3A, a first source/drain region 102 is deposited on a glass substrate 101. In accordance with the exemplary embodiment described, this first source/drain region 102 is produced from a material which is electrically conductive and (unlike in the first two exemplary embodiments) does not have a strongly catalytic action for the growth of carbon nanotubes (for example polysilicon material). A thin nickel layer is applied to the first source/drain region 102 and patterned using a lithography process and an etching process, in such a manner that catalyst material spots 301 formed from nickel material, which has a catalytic action for the growth of carbon nanotubes, are formed on the surface of the layer sequence 300. The catalyst material spots 301 have a dimension of approximately 50 nm and evidently serve as nuclei for the growth of carbon nanotubes. In other words, the catalyst material spots 301 define the locations where carbon nanotubes 122 will subsequently be grown.

To obtain the layer sequence 310 shown in FIG. 3B, carbon nanotubes 122 are grown on the catalyst material spots 301 using a CVD process. On account of the strong catalytic action of the catalyst material spots 301, carbon nanotubes 122 grow substantially vertically on the first source/drain region 102 even without the provision of pores.

Proceeding from the layer sequence 310, the processing can be continued in the same way as proceeding from FIG. 2C following the removal of the silicon oxide layer 211.

Figure 4:
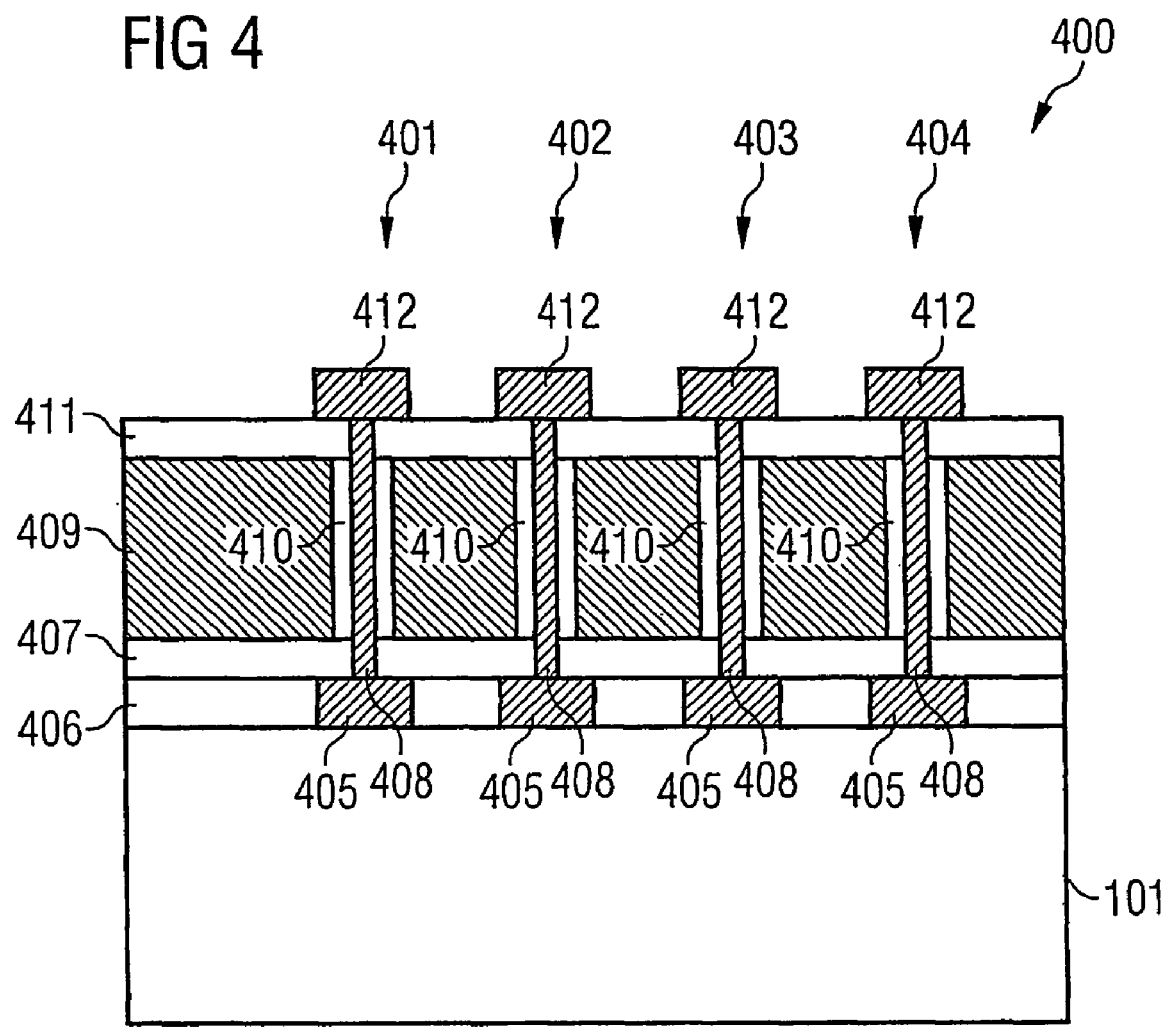
FIG. 4 shows a memory cell array in accordance with an exemplary embodiment of the invention.

The following text, referring to FIG. 4, describes a memory cell array 400 with four memory cells 401 to 404 in accordance with a preferred exemplary embodiment of the invention.

First source/drain regions 405 of the memory cells 401 to 404 are formed on a glass substrate 101, electrically insulated from one another by means of a first electrically insulating auxiliary layer 406. A vertical carbon nanotube 408 is formed between each first source/drain region 405 and second source/drain region 412 on the surface of the memory cell array 400, and the carbon nanotube 408 is coupled to in each case two source/drain regions 405, 412. Each of the carbon nanotubes 408 is surrounded by an aluminum oxide layer as gate-insulating charge storage layer 410. A gate region 409 that is common to the four memory cells 401 to 404 shown in FIG. 4 is formed around the gate-insulating charge storage layer 410. The gate region 409 is electrically decoupled from the source/drain regions 405 and 412 by means of second and third electrically insulating layers 407 and 411, respectively. Each of the memory cells 401 to 404 can be driven individually by means of the separate source/drain regions 405, 412 of each memory cell 401 to 404. Furthermore, the electrical conductivity of the channel region 408 of each memory cell 401 to 404 can be controlled by applying a corresponding electrical voltage to the gate region 409. An information item of one bit can be programmed into, erased from or read of each of the memory cells 401 to 404, which information item is coded in the quantity and charge carrier type of electrical charge carriers introduced into a respective gate-insulating charge storage layer 410. Corresponding electrical potentials can be applied to the corresponding terminals 405, 410, 412 of a respective memory cell 401 to 404 for programming, erasing or reading, in the same way as in a conventional NROM memory.

The memory cell array 400 constitutes a layer sequence made up of a multiplicity of substantially planar layers which are arranged above one another and through which the nanoelements 408 extend vertically. The nanoelements 408 are electrically contact-connected on both sides by means of first and second wiring planes 405 and 412. The modular circuit architecture shown in FIG. 4 allows complex circuits to be constructed with little outlay.

The following publications are cited in this document:

[1] Harris, P. J. F. (1999) "Carbon Nanotubes and Related Structures—New Materials for the Twenty-first Century.", Cambridge University Press, Cambridge, p. 1 to 15, 111 to 155

[2] DE 100 36 897 C1

[3] Wind, S. J., Appenzeller, J. Martel, R., Derycke, V., Avouris, P. (2002) "Vertical scaling of carbon nanotube field-effect transistors using top gate electrodes", Applied Physical Letters, Volume 80, No. 20, 3817-3819

[4] EP1,170,799 A2

[5] Fuhrer, M. S., Kim, B. M., Durkop, T., Brintlinger, T. (2002) "High-Mobility Nanotube Transistor Memory", Nanoletters Vol. 2, No. 7, pp. 755-759
[6] Radosavljevic, M., Freitag, M., Thadani, K. V., Johnson, A. T. (2002) "Nonvolatile Molecular Memory Elements Based on Ambipolar Nanotube Field Effect Transistors", Nanoletters, Vol. 2, No. 7, pp. 761-764
[7] US 2002/0001905 A1
[8] DE 100 32 370 C1
[9] U.S. Pat. No. 6,361,861 B2
[10] US 2001/0023986 A1

| List of references | |
| --- | --- |
| 100 | Layer sequence |
| 101 | Glass substrate |
| 102 | First source/drain region |
| 103 | First electrically insulating layer |
| 104 | Gate region |
| 110 | Layer sequence |
| 111 | Second electrically insulating layer |
| 112 | Via holes |
| 120 | Nonvolatile memory cell |
| 121 | Gate-insulating charge storage layer |
| 122 | Carbon nanotubes |
| 123 | Second source/drain region |
| 200 | Layer sequence |
| 210 | Layer sequence |
| 211 | Silicon oxide layer |
| 220 | Layer sequence |
| 230 | Layer sequence |
| 231 | Gate-insulating charge storage layer |
| 232 | Electrically conductive layer |
| 240 | Layer sequence |
| 241 | Silicon nitride layer |
| 250 | Nonvolatile memory cell |
| 251 | Electrically insulating decoupling elements |
| 300 | Layer sequence |
| 301 | Catalyst material spots |
| 310 | Layer sequence |
| 400 | Memory cell array |
| 401 | First memory cell |
| 402 | Second memory cell |
| 403 | Third memory cell |
| 404 | Fourth memory cell |
| 405 | First source/drain regions |
| 406 | First electrically insulating auxiliary layer |
| 407 | Second electrically insulating auxiliary layer |
| 408 | Carbon nanotubes |
| 409 | Gate region |
| 410 | Gate-insulating charge storage layer |
| 411 | Third electrically insulating auxiliary layer |
| 412 | Second source/drain regions |

The invention claimed is:

1. A nonvolatile memory cell comprising:
a vertical field-effect transistor with a nanoelement designed as the channel region, the nanoelement containing at least one of a nanotube, a bundle of nanotubes, or a nanorod; and
an electrically insulating layer, which at least partially surrounds the nanoelement, as a charge storage layer and as a gate-insulating layer such that electrical charge carriers can be selectively introduced into or removed from the electrically insulating layer and an electrical conductivity of the nanoelement can be influenced in a characteristic way by electrical charge carriers introduced in the electrically insulating layer.

2. The memory cell as claimed in claim 1, wherein the electrically insulating layer is a silicon oxide/silicon nitride/silicon oxide layer sequence, or an aluminum oxide layer.

3. The memory cell as claimed in claim 1, wherein the nanorod includes silicon, germanium, indium phosphide, gallium nitride, gallium arsenide, zirconium oxide, and/or a metal.

4. The memory cell as claimed in claim 1, wherein the nanotube is a carbon nanotube, a carbon-boron nanotube, a carbon-nitrogen nanotube, a tungsten sulfide nanotube, or a chalcogenide nanotube.

5. The memory cell as claimed in claim 1, further comprising a first electrically conductive layer as a first source/drain region of the field-effect transistor on which the nanoelement is grown.

6. The memory cell as claimed in claim 5, wherein the first electrically conductive layer comprises a catalyst material for catalyzing the formation of the nanoelement.

7. The memory cell as claimed in claim 1, further comprising a second electrically conductive layer as a gate region of the field-effect transistor, which at least partially surrounds the electrically insulating layer.

8. The memory cell as claimed in claim 7, wherein a thickness of the second electrically conductive layer is less than a longitudinal extent of the nanoelement such that the electrically insulating layer which surrounds the nanoelement and the second electulcally conductive layer form a ring structure surrounding part of the nanoelerment.

9. The memory cell as claimed in claim 1, further comprising a third electrically conductive layer as second source/drain region of the field-effect transistor, the third electrically conductive layer is formed on the nanoelement.

10. The memory cell as claimed in claim 1, wherein the memory cell is formed at least one of on or in a substrate made from polycrystalline or amorphous material.

11. the memory cell as claimed in claim 1, wherein the memory cell is formed exclusively from dielectric material, metallic material and a material of the nanostructure.

12. A memory cell array having a plurality of memory cells as claimed in claim 1 formed at least one of next to or on top of one another.

13. A method for fabricating a nonvolatile memory cell, the method comprising:
forming a vertical field-effect transistor with a nanoelement designed as the channel region, the nanoelement containing at least one of a nanotube, a bundle of nanotubes, or a nanorod; and
forming an electrically insulating layer, which at least partially surrounds the nanoelement, as a charge storage layer and as a gate-insulating layer, wherein the electrically insulating layer is designed such that electrical charge carriers can be selectively introduced into or removed from the electrically insulating layer and an electrical conductivity of the nanoelernent can be influenced in a characteristic way by electrical charge carriers introduced in the electrically insulating layer.

14. The method as claimed in claim 13, further comprising:
forming a first electrically conductive layer as a first source/drain region of the field-effect transistor;
forming a second electrically conductive layer as a gate region of the field-effect transistor;
uncovering a subregion of the first electrically conductive layer by a via hole being introduced into the second electrically conductive layer;
forming the electrically insulating layer on a surface of the via hole; and
growing the nanoelement in the via hole on the uncovered subregion of the first electrically conductive layer.

15. The method as claimed in claim 13, further comprising:
   forming a first electrically conductive layer as a first source/drain region of the field-effect transistor;
   forming an auxiliary layer;
   uncovering a subregion of the first electrically conductive layer by a via hole being introduced into the auxiliary layer;
   growing the nanoelement in the via hole on the uncovered subregion of the first electrically conductive layer;
   the auxiliary layer is removed; and
   applying the electrically insulating layer to a surface of the nanoelement.

16. The method as claimed in claim 13, initially growing the nanoelement vertically while standing freely on a source/drain region, and then forming a remainder of the vertical field-effect transistor.

17. A nonvolatile memory cell comprising:
   a substrate;
   a first electrically conductive layer disposed on the substrate;
   a channel region formed by a nanoelement disposed on the first electrically conductive layer extending vertically on the substrate, the nanoelement containing at least one of a nanotube, a bundle of nanotubes, or a nanorod;
   a first electrically insulating layer at least partially surrounding the nanoelement;
   a second electrically conductive layer at least partially surrounding the first electrically insulating layer; end
   a third electrically conductive layer on the nanoelement.

18. The memory cell as claimed in claim 17, wherein the first electrically conductive layer comprises a catalyst material for catalyzing formation of the nanoelement.

19. The memory cell as claimed in claim 17, wherein a thickness of the second electrically conductive layer is less than a longitudinal extent of the nanoelement such that the first electrically insulating layer which surrounds the nanoelement and the second electrically conductive layer form a ring structure surrounding part of the nanoelement.

20. The memory cell as claimed in claim 17, further comprising electrically insulating decoupling elements disposed between the second and third electrically conductive layers.

21. The memory cell as claimed in claim 17, wherein the first electrically insulating layer is disposed between the second and third electrically conductive layers.

22. The memory cell as claimed in claim 17, further comprising a second electrically insulating layer at least partially surrounding the second electrically conductive layer.

23. The memory cell as claimed in claim 22, wherein the nanoelement is planar with the second electrically insulating layer.

24. The memory cell as claimed in claim 22, wherein the nanoelement is non-planar with the second electrically insulating layer such that the nanoelement extends farther from the substrate than the second electrically insulating layer.

25. The memory cell as claimed in claim 22, wherein the second electrically conductive layer contacts an end of the nanoelement and an upper surface of the second electrically insulating layer.

26. The memory cell as claimed in claim 17, further comprising a third electrically insulating layer disposed between the first and second electrically conductive layers.

* * * * *

UNITED STATES PATENT AND TRADEMARK OFFICE
CERTIFICATE OF CORRECTION

PATENT NO.       : 7,265,376 B2
APPLICATION NO.  : 10/533215
DATED            : September 4, 2007
INVENTOR(S)      : Andrew Graham et al.

It is certified that error appears in the above-identified patent and that said Letters Patent is hereby corrected as shown below:

On the Title Page

Page 2, column 1, line 4, under "U.S. PATENT DOCUMENTS", before "Roesner" delete "5/2004" and substitute --5/2002-- in its place.

Page 2, column 1, line 9, under "U.S. PATENT DOCUMENTS", after "9/2002" delete "Cui et al." and substitute --Lieber et al.-- in its place.

In the Claims

Column 12, in claim 8, line 24, after "and the second" delete "electulcally" and substitute --electrically-- in its place.

Column 13, in claim 17, line 30, after "electrically insulating layer;" delete "end" and substitute --and-- in its place.

Signed and Sealed this

Twenty-seventh Day of November, 2007

JON W. DUDAS
*Director of the United States Patent and Trademark Office*